(12) United States Patent
Kyomasu et al.

(10) Patent No.: US 6,449,516 B1
(45) Date of Patent: Sep. 10, 2002

(54) BONDING METHOD AND APPARATUS

(75) Inventors: Ryuichi Kyomasu, Kodaira; Motohiko Kato, Higashikurume, both of (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/401,155

(22) Filed: Jul. 1, 1999

(30) Foreign Application Priority Data

Jul. 3, 1998 (JP) ............................................. 10-189118

(51) Int. Cl.⁷ .................... G05B 19/18; G06F 19/00; G05D 1/10; B23K 31/12; G06K 9/00
(52) U.S. Cl. ........................... 700/58; 700/57; 700/59; 700/114; 700/302; 228/105; 382/151
(58) Field of Search ............................... 700/56, 57, 58, 700/59, 192, 302, 114, 193; 228/180.5, 4.5, 904, 8–11, 102–105; 382/151, 152

(56) References Cited

U.S. PATENT DOCUMENTS

| | | | | | |
|---|---|---|---|---|---|
| 5,119,436 A | * | 6/1992 | Holdgrafer | ................... | 382/146 |
| 5,541,834 A | * | 7/1996 | Tomigashi et al. | ............ | 700/59 |
| 5,570,184 A | * | 10/1996 | Armington et al. | ......... | 356/620 |
| 5,583,756 A | * | 12/1996 | Sasano | ........................ | 700/59 |
| 5,615,821 A | * | 4/1997 | Sasano | ........................ | 228/102 |
| 5,702,049 A | * | 12/1997 | Biggs et al. | ................ | 228/105 |
| 5,870,489 A | * | 2/1999 | Yamazaki et al. | .......... | 382/151 |
| 6,129,259 A | * | 10/2000 | Stansbury | .................... | 228/105 |

FOREIGN PATENT DOCUMENTS

| | | |
|---|---|---|
| JP | S59-69939 A | 4/1984 |
| JP | H1-161727 A | 6/1989 |
| JP | H4-343235 A | 11/1992 |
| JP | H6-224248 A | 8/1994 |
| JP | 2568125 B | 10/1996 |

* cited by examiner

Primary Examiner—Leo Picard
Assistant Examiner—Ryan Jarrett
(74) Attorney, Agent, or Firm—Koda & Androlia

(57) ABSTRACT

In a bonding method and apparatus, a position-detecting camera is moved to a point above reference marks, and the positional relationship between the reference marks and the optical axis of the position-detecting camera is measured by the position-detecting camera, a bonding tool is moved to a point above the reference marks in accordance with an amount of offset stored in memory beforehand, the positional relationships between the reference marks and the tool are measured by an offset-correcting camera, and an accurate amount of offset is determined by correcting the mount of offset stored in memory beforehand based upon such a measurement result.

6 Claims, 8 Drawing Sheets

BONDING METHOD AND APPARATUS

BACKGROUND OF THE INVENTION

1. Field of the Invention

The present invention relates to a bonding method and apparatus and more particularly to a method and apparatus for correcting the offset amount between the optical axis of a position-detecting camera, which detects the bonding position, and the axial center of the tool.

2. Prior Art

A general structure of a wire bonding apparatus will be first presented below.

A position-detecting camera which is used to detect the positions of bonding points on semiconductor devices, and a bonding arm which has a bonding tool that performs bonding attached to one end, are disposed on a bonding head which is mounted on an XY table. These parts are provided on the bonding head so that the optical axis of the position-detecting camera and the axial center of the tool are separated (or are not aligned) by a predetermined distance so that the tool and bonding arm do not interfere with the field of vision of the position-detecting camera when the position-detecting camera detects the position of a bonding point. Generally, this distance between the optical axis of the position-detecting camera and the axial center of the tool is called "offset".

Since the position-detecting camera is used to determine a reference point for ascertaining the position to which the tip end of the tool is to be moved, it is necessary that the distance by which the position-detecting camera is offset from the tool be accurately set. Examples of conventional offset setting methods are disclosed in, for example, Japanese Patent Application Laid-Open (Kokai) No. S59-69939 (hereafter referred to as "Conventional Example 1"), Japanese Patent Application Laid-Open (Kokai) No. H6-224248 (hereafter referred to as "Conventional Example 2"), and Japanese Patent No. 2568125 (hereafter referred to as "Conventional Example 3").

In Conventional Example 1, an image of the pressure mark of the tool is photoelectrically converted by a position-detecting camera (photoelectric transducer), and the center of the pressure mark of the tool is determined by processing the resulting image signal; then, the offset is determined and set in accordance with this information.

In Conventional Example 2, one pad on the semiconductor chip is imaged by a position-detecting camera, and the center coordinates of the pad are determined by processing this image data. Next, trial bonding of the ball formed on the tip end of the wire is performed by the tool in the vicinity of the pad. Then, the XY table is driven, and the trial-bonded ball is imaged by the position-detecting camera, after which the center coordinates of the ball are determined by processing this image data. The offset is set in accordance with the center coordinates of the pad and the center coordinates of the ball.

The bonding stage contains a heater and is heated to a high temperature by this heater; as a result, the position-detecting camera holder and bonding arm are caused to undergo thermal expansion by the resulting radiant heat. Consequently, the amount of offset changes according to the difference between the amount of elongation of the position-detecting camera holder and the amount of elongation of the bonding arm caused by the thermal expansion, so that a positional discrepancy is generated in the bonding position. Correction of the amount of offset resulting from this thermal effect can also be accomplished using the methods of the Conventional Examples 1 and 2.

In Conventional Example 3, a tool edge detector consisting of an optical fiber detector that detects the edge of the tool is provided, and the position of the position-detecting camera does not change. Instead, discrepancies in the amount of offset generated as a result of changes in the tool position caused by thermal effects are corrected. In other words, only discrepancies in the position of the tool caused by thermal effects are detected.

It is assumed that the offset is accurately set beforehand, and only the correction of discrepancies in the amount of offset caused by thermal effects is dealt with. This is disclosed in, for example, Japanese Patent Application Laid-Open (Kokai) Nos. H1-161727 and H4-343235.

In Conventional Examples 1 and 2, bonding is performed with the approximate offset adjusted, and the amount of offset is corrected and set according to the amount of deviation of the pressure mark of the tool or the position of the ball produced by this bonding. However, this method involves the problems as described below.

First of all, in Conventional Example 1, the amount of offset is corrected after bonding is performed in an unsatisfactory position. In other words, the next bonding position is corrected after a defective product is manufactured. In Conventional Example 2, in order to avoid the manufacture of such a defective product, trial bonding is performed in a position which has no effect on the actual bonding position of the lead of a lead frame of a lead frame. However, depending on the lead involved, there may be cases in which the space in which bonding can be performed is so narrow that no positional shift is allowed, so that there is an aversion to shifted bonding for the purpose of correction; accordingly, the method cannot be applied to such semiconductor devices. Furthermore, trial bonding and subsequent correction work result in a waste of production time, so that productivity is hindered.

Secondly, in regard to the magnification of the position-detecting camera used to detect positions in the bonding apparatus, a large visual field is required to some extent; accordingly, the magnification is low, and the detection of positions on the order of $\mu$m is difficult. In particular, unlike patterns that are created exclusively for use in correcting positions, actual tool pressure marks or balls show individual differences in their image, so that the detection of accurate positions is difficult. Accordingly, it is described in Conventional Example 1 that a zoom lens is used; however, since an inner lens is moved in a zoom lens, the image position inevitably changes, thus causing the offset to change. Consequently, the use of a zoom lens is not realistic in a bonding apparatus, and detection is therefore performed "as is" at a low magnification, and the precision of positional detection is poor.

Third, since images of the tool pressure mark or ball at the time of bonding show individual differences, accurate positions cannot be determined.

In Conventional Example 3, no detection of the tool pressure mark or ball position is made at the time of bonding unlike Conventional Examples 1 and 2; accordingly, the problems arising in Conventional Examples 1 and 2 do not occur in Conventional Example 3. However, since only the fluctuation of the tool caused by thermal effects is detected in Conventional Example 3, the following problem arises:

Since the position-detecting camera is installed on the tool side and detects the position of the bonding point, this camera is susceptible to the effects of radiant heat arising from the high temperature of the bonding stage. As a result, the position-detecting camera holder undergoes thermal expansion, and a fluctuation in the position of the position-detecting camera cannot be avoided. Especially in cases where it is attempted to improve the bonding precision to sub-pm units as is required in a bonding apparatus, this cannot be satisfactorily achieved by detection of the positional fluctuation of the tool alone.

SUMMARY OF THE INVENTION

The object of the present invention is to provide a bonding method and apparatus which allows high-precision setting and correction of the offset without hindering productivity.

The method of the present invention which solves the prior art problems is used for a bonding apparatus in which a position-detecting camera that detects the position of a part to be bonded and a tool that performs bonding are offset, and in the method of the present invention:

the position-detecting camera is moved to a point above a reference marking provided on a reference member, and the positional relationship between the reference marking and the optical axis of the position-detecting camera is measured by the position-detecting camera;

the tool is moved to a point above the reference marking in accordance with an amount of offset stored in memory beforehand, the positional relationship between the reference marking and the tool is measured by an offset-correcting camera, and a desired accurate amount of offset is determined by correcting the amount of offset stored in memory beforehand on the basis of the measurement result.

The apparatus of the present invention which solves the prior art problems includes a position-detecting camera that detects the position of a part to be bonded and a tool that performs bonding that are offset, and further includes:

a reference member on which a reference marking is disposed, an offset-correcting camera which detects the reference marking, and a calculation and control device which determines an accurate amount of offset by correcting an amount of offset stored in memory beforehand on the basis of measurement result that consists of:

a measured value obtained when the position-detecting camera is moved to a point above the reference marking on the reference member, and the positional relationship between the reference marking and the optical axis of the position-detecting camera is measured by the position-detecting camera, and another measured value obtained when the tool is moved to a point above the reference marking in accordance with the amount of offset stored in memory beforehand, and the positional relationship between the reference marking and the tool is measured by the offset-correcting camera.

In the method and apparatus described above, the reference member is a transparent member, and the offset-correcting camera is positioned beneath the reference member so as to face the reference member.

In addition, in the above method and apparatus, the offset-correcting camera is positioned to one side of the reference member so as to face the reference member.

DETAILED DESCRIPTION OF THE INVENTION

One embodiment of the present invention will be described with reference to FIGS. 1 through 5.

Figure 1:
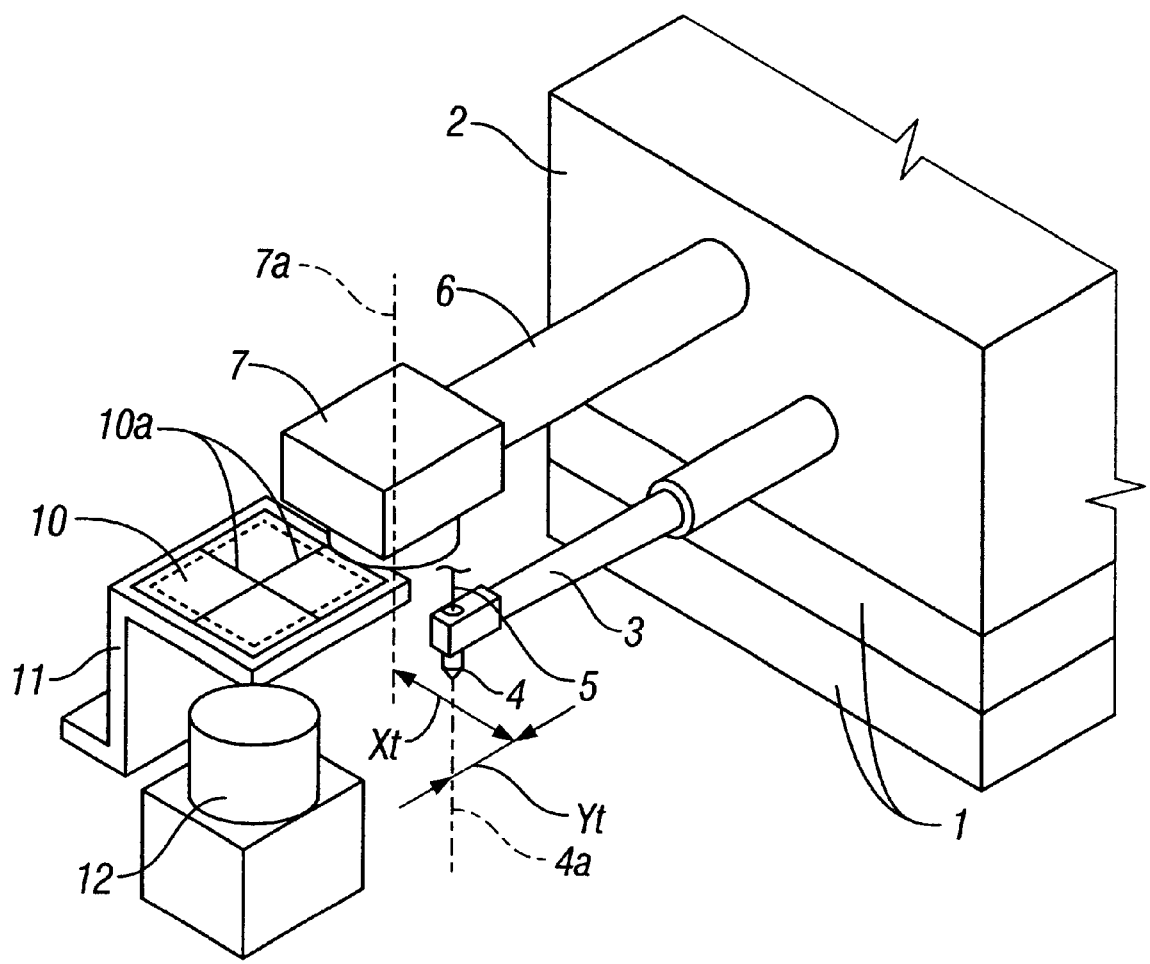
FIG. 1 is a perspective view which illustrates one embodiment of the bonding apparatus according to the present invention.

As shown in FIG. 1, a bonding arm 3 is installed on a bonding head 2 mounted on an XY table I so as to be movable upward and downward, and this bonding arm 3 is driven upward and downward (which is parallel to the line 7a in FIG. 1) by a vertical driving means (not shown). A tool 4 is attached to the tip end portion of the bonding arm 3, and a wire 5 is passed through this tool 4. A camera holder 6 is fastened to the bonding head 2, and a position-detecting camera 7 is fastened to the tip end portion of the camera holder 6. The optical axis 7a of the position-detecting camera 7 is oriented vertically downward; and the axial center 4a of the tool 4 is also likewise oriented vertically. The optical axis 7a and axial center 4a are offset by the offset amounts Xt and Yt in the X and Y directions. The above structure is a structure known in the prior art.

A reference plate supporting stand 11 on which a reference plate 10 is positioned and carried is disposed in the vicinity of a bonding stage (not shown) on which a semiconductor device (not shown) is positioned and carried. An offset-correcting camera 12 is disposed beneath the reference plate 10, with the detecting section of the camera facing upward. The reference plate 10 is a transparent plate and is provided with reference marks 10a.

Figure 2:
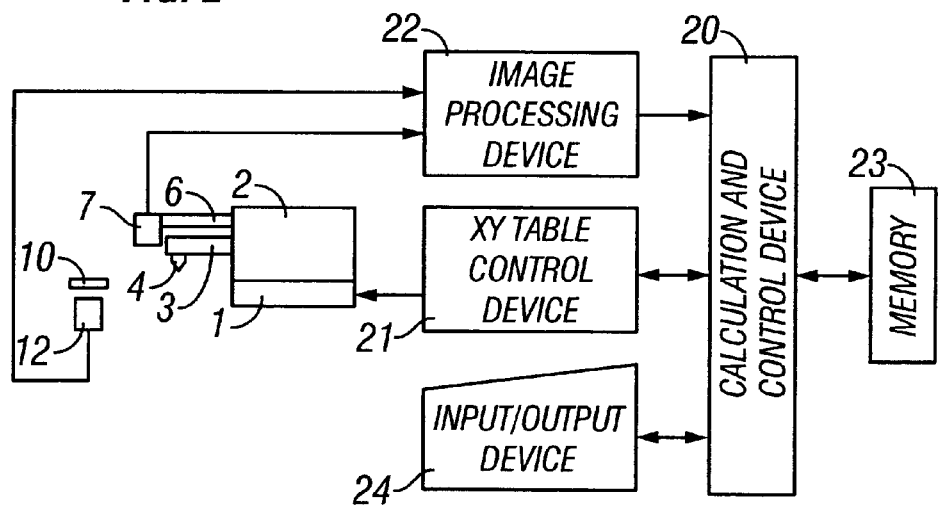
FIG. 2 is a block diagram of the control means of the bonding apparatus.

As shown in FIG. 2, the XY table 1 is driven via an XY table control device 21 by commands from a calculation and control device 20. The images acquired by the position-detecting camera 7 and offset-correcting camera 12 are processed by an image processing device 22, and accurate offset amounts Xt and Yt are calculated by the calculation and control device 20 (which is a computer) using a method that will be described later. Offset amounts Xw and Yw are stored in a memory 23 beforehand. The reference numeral 24 designates an input/output device. Here, if the differences between the accurate offset amounts Xt and Yt and the offset amounts Xw and Yw stored in the memory 23 beforehand, i. e., the offset correction amounts, are designated as $\Delta X$ and $\Delta Y$, then the relationships shown in Equation 1 are obtained.

$$Xt = Xw + \Delta X$$

$$Yt = Yw + \Delta Y \qquad \text{Equation 1}$$

Figure 4:
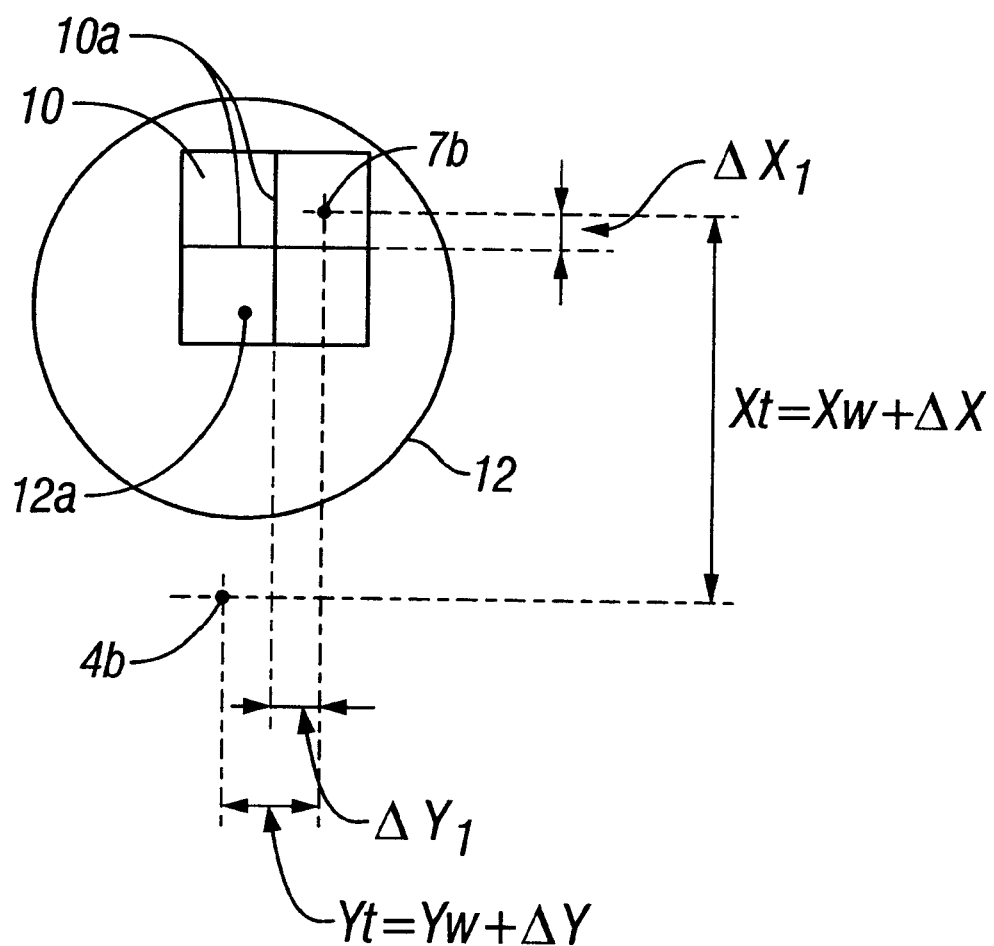
FIG. 4 is an explanatory plan view showing the state in which the relationships between the position-detecting camera and the reference marks are measured in a process following the process shown in FIG. 3.
Figure 5:
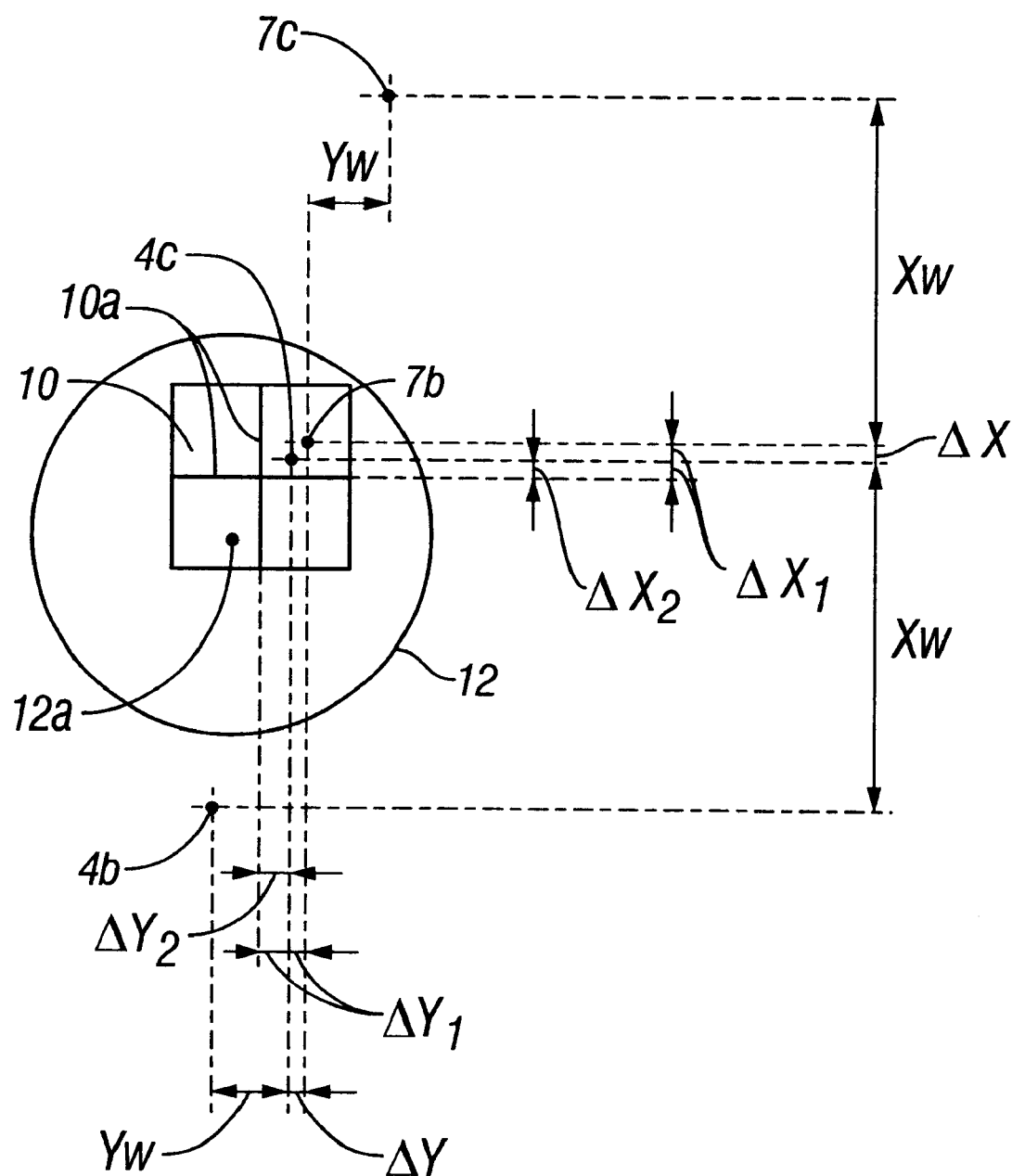
FIG. 5 is an explanatory plan view showing the state in which the relationships between the reference marks and the tool are measured by the offset-correcting camera in a process following the process shown in FIG. 4.
Figure 6A:
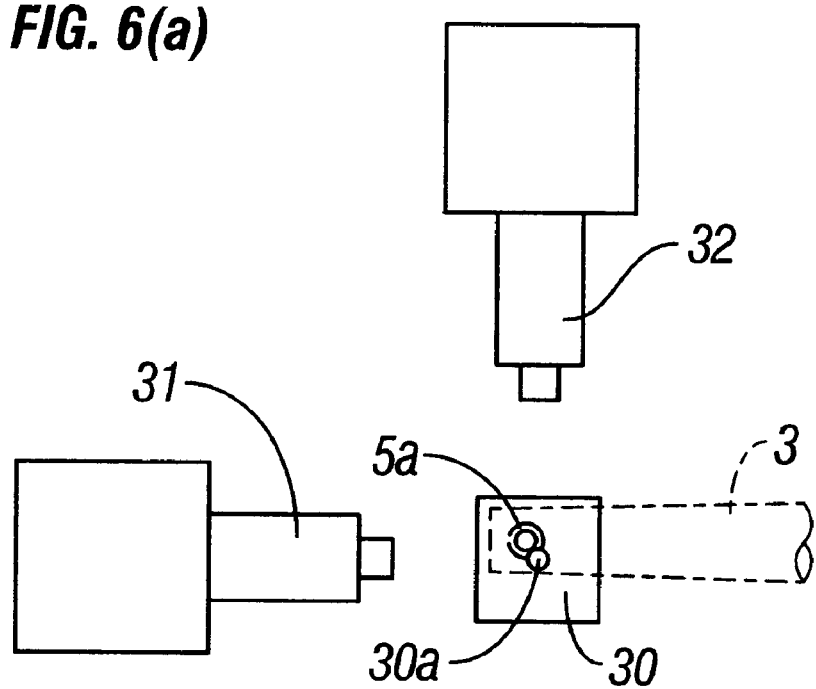
FIG. 6(a) is a top plan view which illustrates another embodiment of the bonding apparatus of the present invention.
Figure 6B:
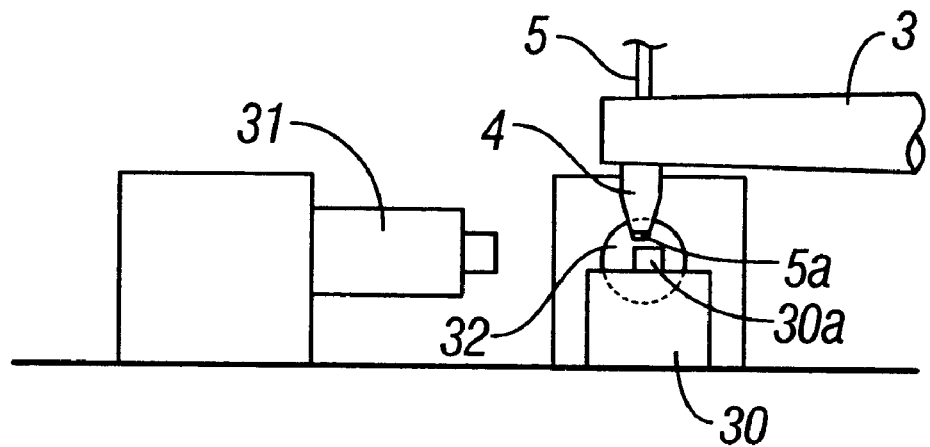
FIG. 6(b) is a side view thereof.

Next, the method used to set (correct) the offset amounts Xt and Yt will be described with reference to FIGS. 3 through 5.

Figure 3:
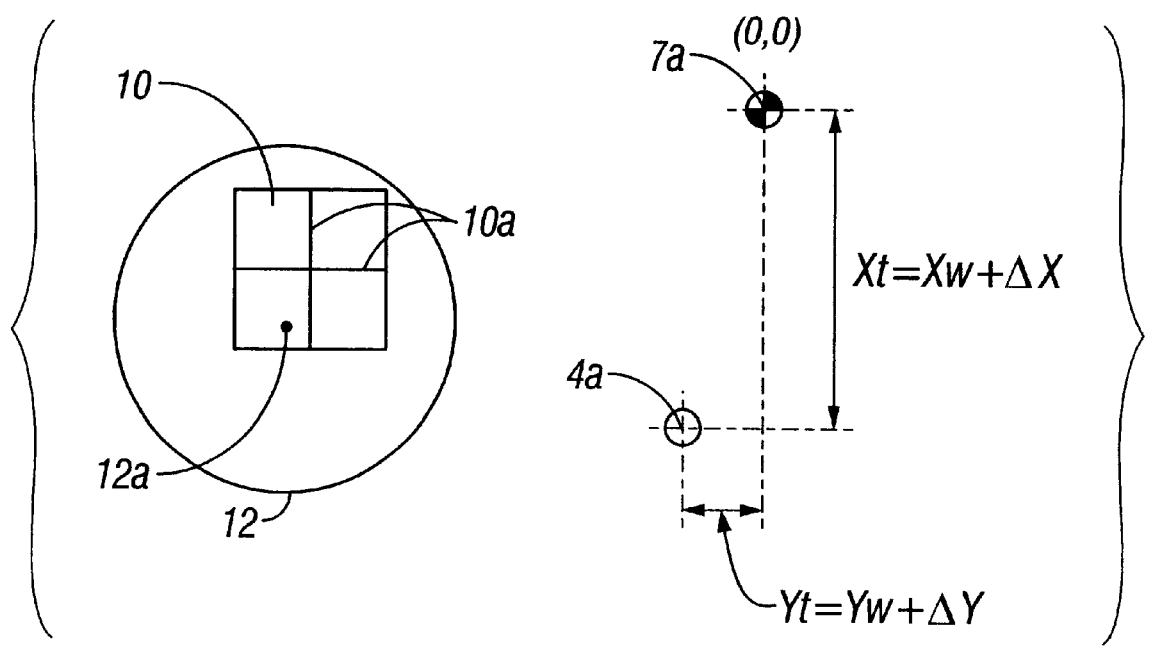
FIG. 3 is an explanatory plan view which illustrates offset correction, showing the state prior to the start of such a correction.

FIG. 3 shows a state in which the position-detecting camera 7 is positioned at the origin (0, 0). The reference numeral 12a indicates the optical axis of the offset-correcting camera 12. From the state shown in FIG. 3, the XY table 1 is driven via the XY table control device 21 by commands from the calculation and control device 20 so that the optical axis 7a of the position-detecting camera 7 is positioned above the reference plate 10. Accordingly, as shown in FIG. 4, the optical axis of the position-detecting camera 7 is positioned at 7b; and in this case, the axial center of the tool 4 is positioned at 4b.

Here, it is sufficient if the amount of movement of the position-detecting camera 7 is enough to place the camera in a position that allows detection of the reference marks 10a; and it is not necessary to align the optical axis 7b of the position-detecting camera 7 with the center of the reference marks 10a. Accordingly, the respective relationships $\Delta X_1$ and $\Delta Y_1$ between the reference marks 10a and the position-detecting camera 7 are measured by the position-detecting camera 7.

Next, the calculation and control device 20 drives the XY table 1 via the XY table control device 21 in accordance with the offset amounts Xw and Yw stored beforehand in the memory 23. As a result, the tool 4 is moved to a point above the reference plate 10, so that the axial center of the tool 4 is moved from 4b to the position indicated by 4c, and the optical axis of the position-detecting camera 7 is moved from 7b to the position indicated by 7c, as shown in FIG. 5. If the offset amounts Xw and Yw stored beforehand in memory are the accurate offset amounts Xt and Yt, then the offset correction amounts $\Delta X$ and $\Delta Y$ are 0, so that the position 4c coincides with the position 7b. However, in cases where the offset amounts Xw and Yw stored beforehand in memory are approximate values, or in cases where the camera holder 6 or bonding arm 3 has undergone thermal expansion as a result of thermal effects so that the offset amounts Xw and Yw have changed, then the position 4c does not coincide with the position 7b, and the errors (offset correction amounts) $\Delta X$ and $\Delta Y$ are generated.

After the tool 4 is moved to a point above the reference plate 10 as described above, the tool 4 is lowered to a height which is such that the tool 4 almost contacts the reference plate 10. Then, both the reference marks 10a and the tip end of the tool 4 are imaged by the offset-correcting camera 12, and the accurate positional relationships of these parts (the reference marks 10a and the tip end of the tool 4), which are represented by $\Delta X_2$ and $\Delta Y_2$, respectively, are measured. The offset correction amounts $\Delta X$ and $\Delta Y$ are calculated from these measured values $\Delta X_2$ and $\Delta Y_2$ and the measured values $\Delta X_1$ and $\Delta Y_1$ using Equation 2 shown below.

$$\Delta X = \Delta X_1 - \Delta X_2$$

$$\Delta Y = \Delta Y_1 - \Delta Y_2 \qquad \text{Equation 2}$$

Accordingly, the calculation and control device 20 calculates the offset correction amounts $\Delta X$ and $\Delta Y$ using Equation 2, and calculates the accurate offset amounts Xt and Yt by applying the offset correction amounts $\Delta X$ and $\Delta Y$ to the offset amounts Xw and Yw (stored in memory beforehand) using Equation 1. As a result, the offset amounts Xw and Yw stored in the memory 23 are corrected to the accurate offset amounts Xt and Yt.

If the X and Y axes of the XY table that drives the bonding head 2 do not coincide with the X and Y axes of the offset-correcting camera 12 (i. e., if these axes are rotated in the horizontal plane in relative terms), then an error, although slight, will be introduced. The correction of this error can be accomplished by moving the tool 4 in the range of the visual field of the offset-correcting camera 12, and measuring the deviation between the X and Y axes of the XY table and the X and Y axes of the offset-correcting camera 12.

Thus, since it is not necessary to perform actual bonding, there is no need to perform trial bonding on a semiconductor device, and the production of defective products can therefore be avoided. Furthermore, since offset correction can be performed as required at any time during the bonding of a single device, an offset correction operation can be performed immediately prior to bonding regardless of the bonding sequence, and offset errors generated by thermal effects can also be corrected.

An offset correction operation during ordinary continuous bonding can be performed in parallel with the conveying operation of the bonding; accordingly, the productivity of the bonding apparatus is not hindered. Moreover, the necessary magnification and illumination system can be used in the offset-correcting camera 12 independently of the position-detecting camera 7. Furthermore, a shape which provides precision can easily be selected for the marks as well.

Furthermore, in the present invention, the positional relationships $\Delta X_1$ and $\Delta Y_2$ between the reference marks 10a and the position-detecting camera 7 are measured, after which the tool 4 is moved by the offset amounts Xw and Yw stored in the memory 23 beforehand, and the positional relationships between the reference marks 10a and the tool 4 are measured by the offset-correcting camera 12; then, the positional relationship between the position-detecting camera 7 and the tool 4 is determined using the reference marks 10a as a reference. Accordingly, the accurate offset amounts Xt and Yt can be determined; and the bonding precision, especially the bonding precision of a wire bonding apparatus, can be improved to a precision on the order of sub-$\mu$m units.

FIGS. 6(a) through 10 illustrate a second embodiment of the present invention. In the first embodiment described in FIGS. 1 through 5, the reference member is the transparent reference plate 10, the reference marking consists of reference marks 10a, and the offset-correcting camera 12 is installed beneath the reference plate 10. In the second embodiment in FIGS. 6 through 10, the reference member 30 is an opaque member, and the reference marking 30a is a circular projection. Furthermore, in the X-axis direction and Y-axis direction on the sides of the reference member 30, an X-axis offset-correcting camera 31 and a Y-axis offset-correcting camera 32 are installed; and the detecting sections of the cameras face the reference marking 30a. The remaining construction of this second embodiment is that same as in the first embodiment.

Figure 7A:
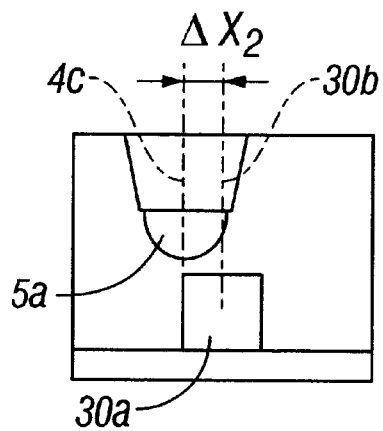
FIG. 7(a) is a diagram illustrating an image acquired by the X-axis offset-correcting camera.
Figure 7B:
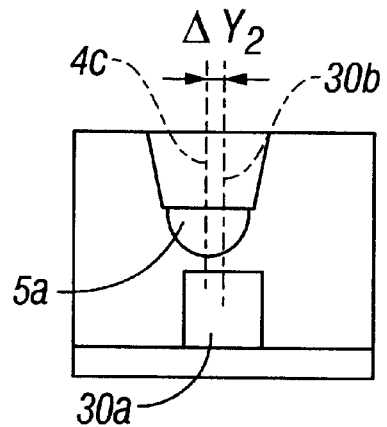
FIG. 7(b) is a diagram illustrating an image acquired by the Y-axis offset-correcting camera.
Figure 8:
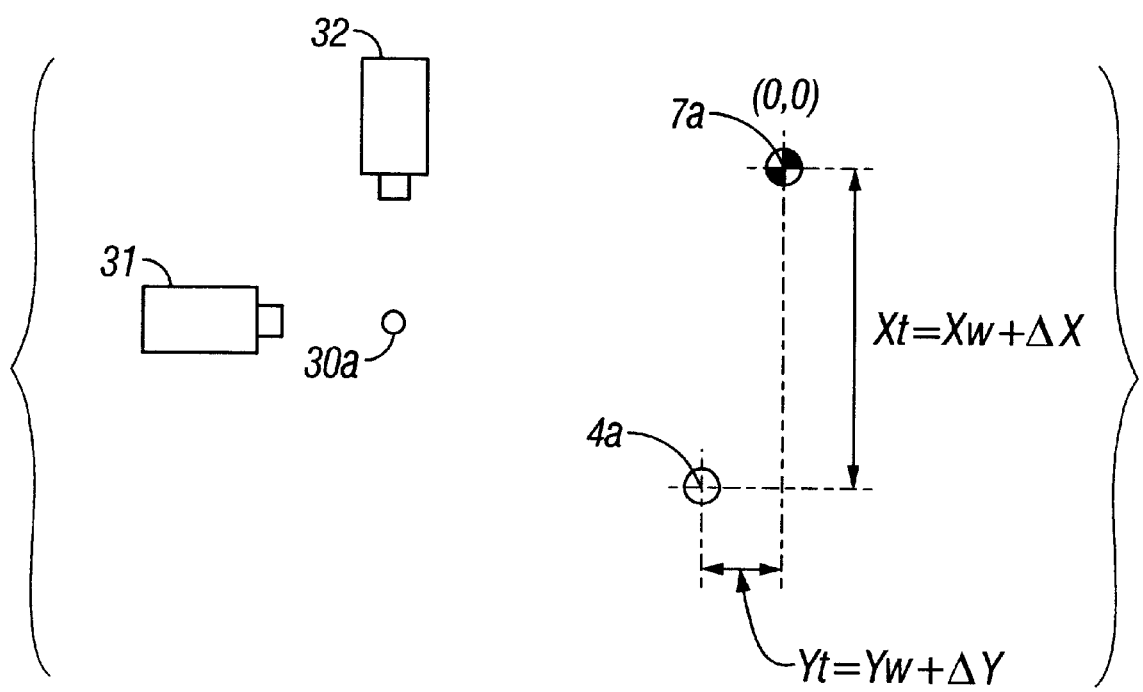
FIG. 8 is an explanatory plan view which illustrates offset correction, showing the state prior to the start of such a correction.
Figure 9:
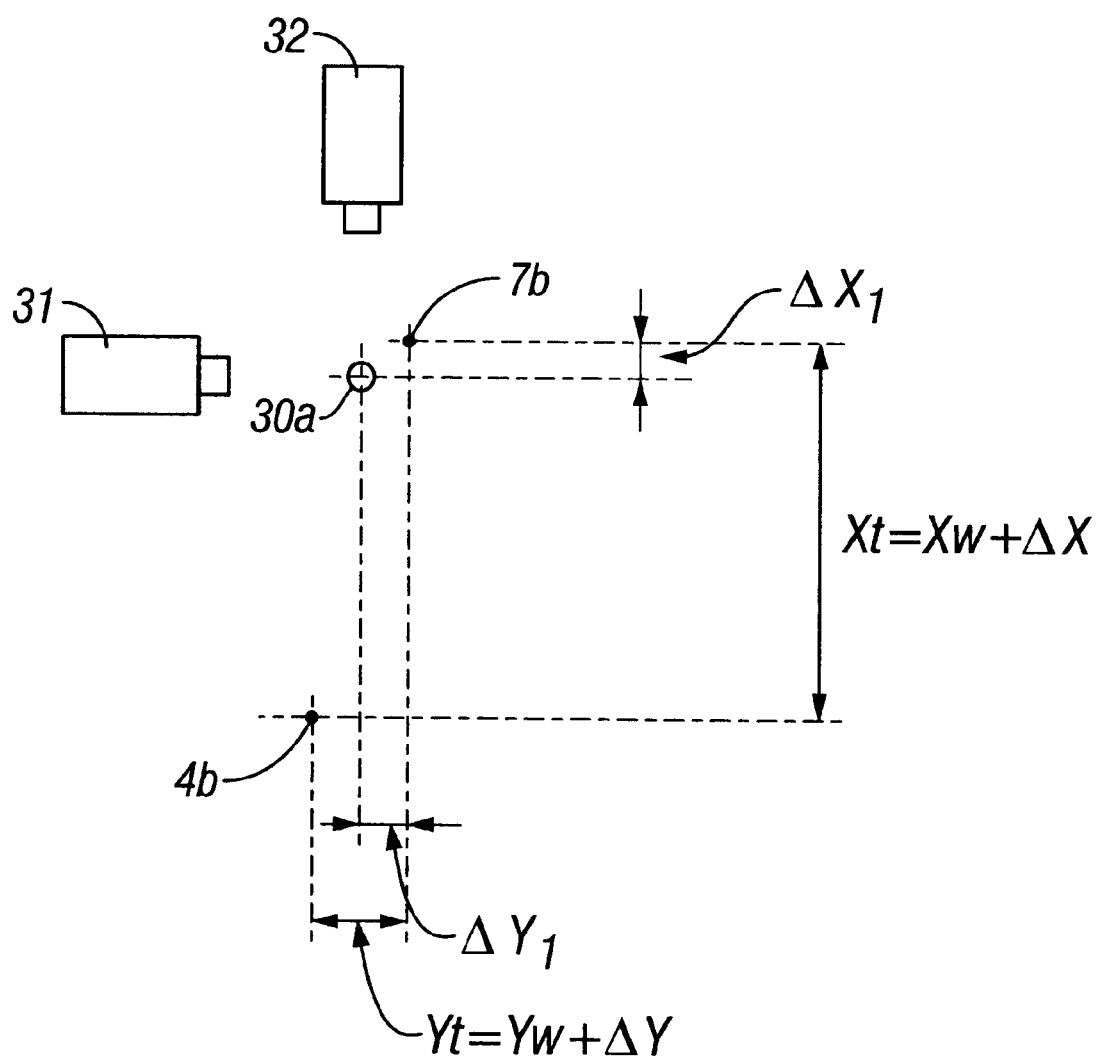
FIG. 9 is an explanatory plan view showing the state in which the relationships between the position-detecting camera and the reference marks are measured in a process following the process shown in FIG. 8.

Next, the method used to set (correct) the offset amounts Xt and Yt shown in Equation 1 will be described with reference to FIGS. 7 through 10. The operations shown in FIGS. 8 and 9 are the same as the operations shown in FIGS. 3 and 4. Thus, FIG. 8 shows a state in which the position-detecting camera 7 is positioned at the origin (0, 0) as in the FIG. 3.

From the state shown in FIG. 8, the XY table 1 is driven by commands from the calculation and control device 20 via the XY table control device 21 so that the optical axis 7a of the position-detecting camera 7 is positioned above the reference member 30, thus causing the optical axis of the position-detecting camera 7 to be positioned at 7b as shown in FIG. 9. The axial center of the tool 4 in this case is positioned at 4b.

It is sufficient if the amount of movement of the position-detecting camera 7 is such that the position-detecting camera 7 is moved to a position that allows detection of the reference marking 30a; and it is not necessary to cause the optical axis 7b of the position-detecting camera 7 to coincide with the center of the reference marking 30a. Thus, the relationships $\Delta X_1$ and $\Delta Y_1$ between the reference marking 30a and the position-detecting camera 7 are measured by the position-detecting camera 7.

Figure 10:
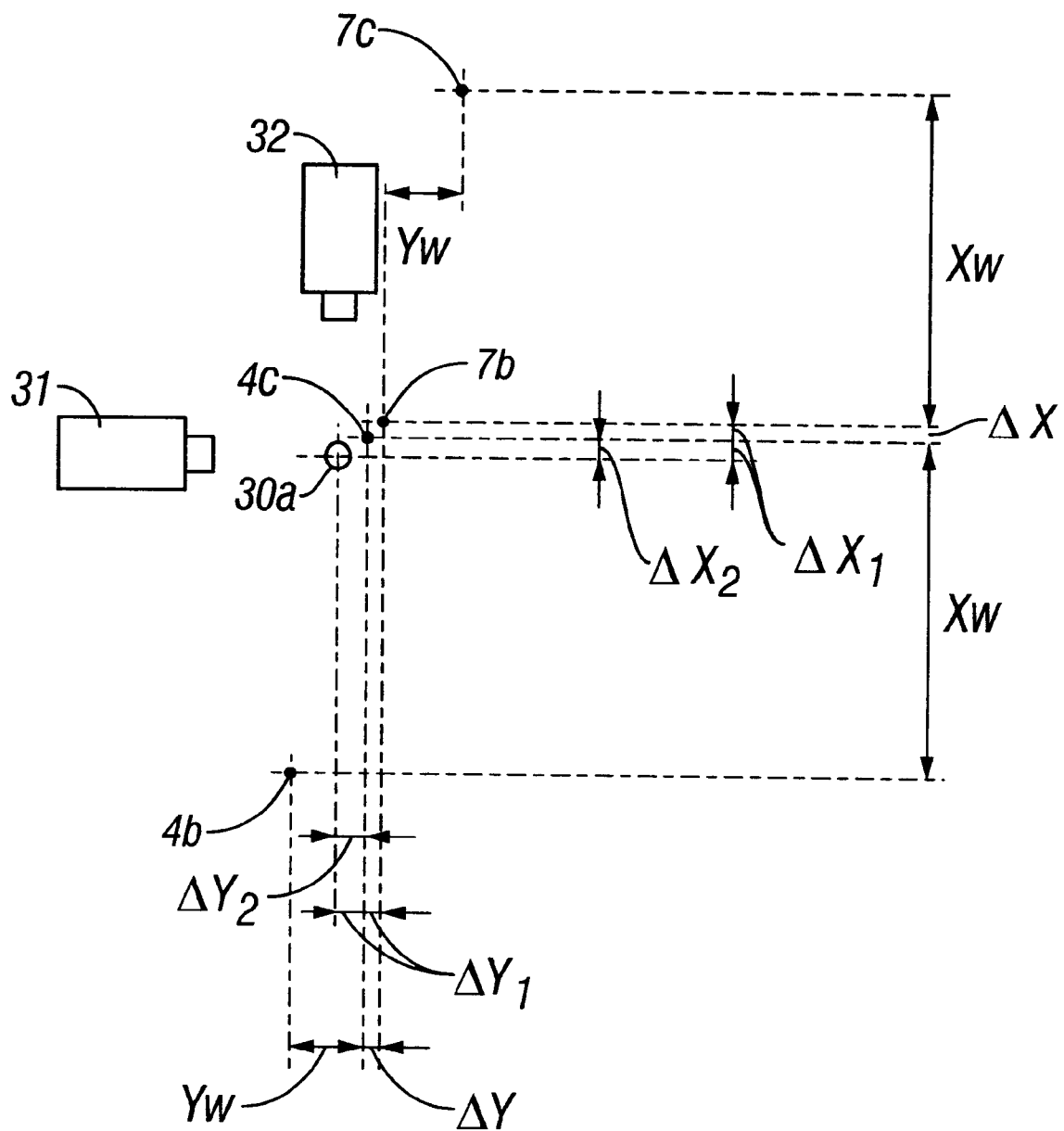
FIG. 10 is an explanatory plan view showing the state in which the relationships between the reference marks and the tool are measured by the offset-correcting camera in a process following the process shown in FIG. 9.

Next, the calculation and control device 20 drives the XY table 1 via the XY table control device 21 in accordance with the offset amounts Xw and Yw stored beforehand in the memory 23. As a result, the tool 4 is moved to a point above the reference member 30, so that the axial center of the tool 4 is moved from the position 4b to the position indicated by 4c, and the optical axis of the position-detecting camera 7 is moved from the position 7b to the position indicated by 7c, as shown in FIG. 10. If the offset amounts Xw and Yw stored beforehand in memory are the accurate offset amounts Xt and Yt, then the offset correction amounts $\Delta X$ and $\Delta Y$ are 0, so that the position 4c coincides with the position 7b. However, in cases where the offset amounts Xw and Yw stored beforehand in memory are approximate values, or in cases where the camera holder 6 or bonding arm 3 has undergone thermal expansion as a result of thermal effects so that the offset amounts Xw and Yw have changed, the position 4c does not coincide with the position 7b, and the errors (offset correction amounts) $\Delta X$ and $\Delta Y$ are generated.

After the tool 4 is moved to a point above the reference member 30 as described above, the tool 4 is lowered to the height which is such that the tool 4 almost contacts the reference marking 30a. Then, both the reference marking 30a and the tip end of the tool 4 are imaged by the X-axis offset-correcting camera 31 and the Y-axis offset-correcting camera 32, and the accurate positional relationships of these parts (the reference marking 30a and the tip end of the tool 4), which are represented by $\Delta X_2$ and $\Delta Y_2$, respectively, are measured. FIG. 7(a) shows the image acquired by the X-axis offset-correcting camera 31, and FIG. 7(b) shows the image acquired by the Y-axis offset-correcting camera 32. In FIGS. 7(a) and 7(b), the reference numeral 4c indicates the vertical center line of the ball 5a, i. e., the axial center of the tool 4, and 30b indicates the axial center of the reference marking 30a. Then, the offset correction amounts $\Delta X$ and $\Delta Y$ are calculated from the measured values $\Delta X_2$ and $\Delta Y_2$ and the measured values $\Delta X_1$ and $\Delta Y_1$ using Equation 2 shown previously.

Accordingly, the calculation and control device 20 calculates the offset correction amounts $\Delta X$ and $\Delta Y$ using Equation 2, and calculates the accurate offset amounts Xt and Yt by applying the offset correction amounts $\Delta X$ and $\Delta Y$ to the offset amounts Xw and Yw (stored in memory beforehand) using Equation 1. As a result, the offset amounts Xw and Yw stored in the memory 23 are corrected to the accurate offset amounts Xt and Yt.

The second embodiment produces the same effect at in the first embodiment. In both of the above described embodiments, the present invention is applied to a wire bonding apparatus; however, it goes without saying that the present invention can be applied to a die bonding apparatus, tape bonding apparatus, flip-chip bonding apparatus, etc.

As seen from the above, in the present invention which is for a bonding method and apparatus and in which a position-detecting camera that detects the position of a part to be bonded and a tool that performs bonding are offset, wherein:

the position-detecting camera is moved to a point above a reference marking on a reference member and the positional relationship between the reference marking and the optical axis of the position-detecting camera is measured by the position-detecting camera, the tool is moved to a point above the reference marking in accordance with an amount of offset stored in memory beforehand, the positional relationship between the reference marking and the tool is measured by an offset-correcting camera, and a desired accurate amount of offset is determined by correcting the amount of offset stored in memory beforehand on the basis of the measurement result.

Accordingly, the offset can be set and corrected with a high degree of precision without hindering productivity.

What is claimed is:

1. A bonding method for a bonding apparatus in which a position-detecting camera that detects a position of a part to be bonded and a tool that performs bonding are offset, the method comprising the steps of:

moving the position-detecting camera to a point above a reference marking on a reference member, measuring the positional relationship between the reference marking and an optical axis of the position-detecting camera by the position-detecting camera, moving the tool to a point above the reference marking in accordance with an amount of offset stored in memory beforehand, measuring the positional relationship between the reference marking and the tool by an offset-correcting camera, and correcting the amount of offset stored in memory beforehand on the basis of the measurement results, thus determining a desired accurate amount of offset.

2. A bonding apparatus in which a position-detecting camera that detects a position of a part to be bonded and a tool that performs bonding are offset, the bonding apparatus comprising:

a reference member on which a reference marking is disposed, an offset-correcting camera which detects the reference marking, and a calculation and control device which determines an accurate amount of offset by correcting an amount of offset stored in memory beforehand on the basis of measurement result that consists of:

a measured value obtained when the position-detecting camera is moved to a point above the reference marking on the reference member and the positional relationship between the reference marking and the optical axis of the position-detecting camera is measured by said position-detecting camera, and a measured value obtained when the tool is moved to a point above the reference marking in accordance with the amount of offset stored in memory beforehand and the positional relationship between the reference marking and the tool is measured by the offset-correcting camera.

3. The bonding method according to claim 1, wherein the reference member is a transparent member, and the offset-correcting camera is positioned beneath the reference member so as to face the reference member.

4. The bonding apparatus according to claim 2, wherein the reference member is a transparent member, and the offset-correcting camera is positioned beneath the reference member so as to face the reference member.

5. The bonding method according to claim 1, wherein the offset-correcting camera is positioned to one side of the reference member so as to face the reference member.

6. The bonding apparatus according to claim 2, wherein the offset-correcting camera is positioned to one side of the reference member so as to face the reference member.

* * * * *